US012763081B2

(12) United States Patent
Liang

(10) Patent No.: US 12,763,081 B2
(45) Date of Patent: Oct. 13, 2026

(54) VEHICLE-MOUNTED HUMAN-MACHINE INTERACTION SYSTEM

(71) Applicant: PATEO CONNECT+ Technology (Shanghai) Corporation, Shanghai (CN)

(72) Inventor: Chen Liang, Shanghai (CN)

(73) Assignee: PATEO CONNECT+ Technology (Shanghai) Corporation, Shanghai (CN)

( * ) Notice: Subject to any disclaimer, the term of this patent is extended or adjusted under 35 U.S.C. 154(b) by 286 days.

(21) Appl. No.: 18/688,407

(22) PCT Filed: Dec. 2, 2021

(86) PCT No.: PCT/CN2021/135025

§ 371 (c)(1),
(2) Date: Mar. 1, 2024

(87) PCT Pub. No.: WO2023/029263

PCT Pub. Date: Mar. 9, 2023

(65) Prior Publication Data

US 2024/0395262 A1 Nov. 28, 2024

(30) Foreign Application Priority Data

Sep. 3, 2021 (CN) ......................... 202111031577.5

(51) Int. Cl.
*G10L 17/00* (2013.01)
*B60Q 5/00* (2006.01)
(Continued)

(52) U.S. Cl.
CPC ................ *G10L 17/22* (2013.01); *B60Q 5/00* (2013.01); *G06V 20/58* (2022.01); *G06V 40/10* (2022.01);
(Continued)

(58) Field of Classification Search
CPC ......... G10L 17/10; G10L 17/22; G10K 9/122; G06V 20/58; G06V 40/10; B60Q 5/00;
(Continued)

(56) References Cited

U.S. PATENT DOCUMENTS

2014/0119587 A1* 5/2014 Chou ....................... H04R 1/44 381/334
2015/0022459 A1 1/2015 Yliaho et al.
(Continued)

FOREIGN PATENT DOCUMENTS

CN 102169686 A 8/2011
CN 204086535 U 1/2015
(Continued)

OTHER PUBLICATIONS

The World Intellectual Property Organization (WIPO) International Search Report for PCT/CN2021/135025 Jun. 9, 2022 6 Pages (including translation).
(Continued)

*Primary Examiner* — Md S Elahee
(74) *Attorney, Agent, or Firm* — Anova Law Group, PLLC

(57) ABSTRACT

A vehicle-mounted human-machine interaction system includes: a piezoelectric sound-generating circuit disposed in a cavity between a body panel as an outer surface of a vehicle and an interior panel as an inner surface of the vehicle and attached to either the body panel or the interior panel; a wake-up subsystem configured to wake up an on-board controller to turn on a human-machine interaction function based on at least one of voices, movements, or images of objects outside the vehicle; and the on-board controller configured to output an audio signal to the piezoelectric sound-generating circuit after being woken by the wake-up subsystem to turn on the human-machine interac-
(Continued)

tion function such that as being excited by the audio signal, the piezoelectric sound-generating circuit vibrates the body panel or the interior panel to emit a voice to an exterior of the vehicle.

20 Claims, 5 Drawing Sheets

(51) Int. Cl.

| | |
|---|---|
| ***G06V 20/58*** | (2022.01) |
| ***G06V 40/10*** | (2022.01) |
| ***G10L 17/10*** | (2013.01) |
| ***G10L 17/22*** | (2013.01) |
| ***H03F 3/183*** | (2006.01) |
| ***H04N 7/18*** | (2006.01) |
| ***H04R 1/02*** | (2006.01) |
| ***H04R 1/28*** | (2006.01) |
| ***H04R 7/04*** | (2006.01) |
| ***H04R 17/00*** | (2006.01) |

(52) U.S. Cl.

CPC .............. *G10L 17/10* (2013.01); *H03F 3/183* (2013.01); *H04N 7/181* (2013.01); *H04R 1/025* (2013.01); *H04R 1/2811* (2013.01); *H04R 7/04* (2013.01); *H04R 17/00* (2013.01); *H03F 2200/03* (2013.01); *H04R 2499/13* (2013.01)

(58) Field of Classification Search

CPC ...... H04R 17/00; H04R 1/2811; H04R 7/045; H04R 1/025; H04R 7/04; H04R 2499/13; H04R 1/44; H03F 3/183; H03F 2200/03

USPC .......................................................... 704/246

See application file for complete search history.

(56) References Cited

U.S. PATENT DOCUMENTS

| | | | |
|---|---|---|---|
| 2018/0065549 A1 | | 3/2018 | Watanabe et al. |
| 2020/0396553 A1 | | 12/2020 | Van et al. |

FOREIGN PATENT DOCUMENTS

| | | | | |
|---|---|---|---|---|
| CN | 104477162 A | | 4/2015 |
| CN | 105501112 A | | 4/2016 |
| CN | 105835877 A | | 8/2016 |
| CN | 107054521 A | | 8/2017 |
| CN | 107371089 A | | 11/2017 |
| CN | 109466433 A | | 3/2019 |
| CN | 110103815 A | | 8/2019 |
| CN | 112805677 A | | 5/2021 |
| JP | 2008035472 A | | 2/2008 |
| JP | 2012253568 A | * | 12/2012 |
| JP | 2016213791 A | | 12/2016 |
| JP | 2018160810 A | | 10/2018 |
| WO | 2017019760 A1 | | 2/2017 |
| WO | 2021049165 A1 | | 3/2021 |

OTHER PUBLICATIONS

The European Patent Office (EPO) The Extended European Search Report for Application No. 21955791.5 Oct. 25, 2024 10 Pages.

* cited by examiner

VEHICLE-MOUNTED HUMAN-MACHINE INTERACTION SYSTEM

CROSS-REFERENCE TO RELATED APPLICATIONS

This application is a national stage application of International Application No. PCT/CN2021/135025, filed on Dec. 2, 2021, which claims priority to Chinese Patent Application No. 202111031577.5, filed with the China National Intellectual Property Administration (CNIPA) on Sep. 3, 2021, the entire contents of all of which are incorporated herein by reference.

TECHNICAL FIELD

The present disclosure relates to the technical field of vehicle control and, more particularly, to a vehicle-mounted human-machine interaction system.

BACKGROUND

Currently, the automobile industry is experiencing development trends of electrification, networking, sharing, and artificial intelligence. These trends have put forward new technical requirements for vehicle driving methods, user interaction experience, vehicle usage patterns, etc., and technical improvements to current vehicle systems are urgently needed to meet these needs.

Current human-machine interaction in vehicles often focuses on interaction between people in the vehicle (such as the driver or passengers) and a vehicle-mounted control terminal. For example, the vehicle-mounted control terminal receives a voice instruction from someone in the vehicle to perform a corresponding operation (e.g., playing music, turning on the air conditioner, etc.) Interaction between people outside the vehicle and the vehicle is currently limited to a vehicle user, for example, a driver turning on or off the vehicle through a smart key or simply controlling the vehicle or part of the vehicle on and off through a mobile phone client. Currently, more adaptable vehicle-mounted human-machine interaction system does not exist to allow the people outside the vehicle to interact with the vehicle (or further with the people inside the vehicle or other remotely located people).

As requirements for vehicle intelligence increase, more and more application scenarios have emerged that require human-machine interaction between the people outside the vehicle and the vehicle. In many cases, the vehicle or the people inside the vehicle want to send prompts or reminder messages to the people outside the vehicle through voice. For example, because noise generated by an electric vehicle is very weak, it is difficult for pedestrians or cyclists on the road to notice the approach of the vehicle based on sound alone. In this case, the vehicle needs to actively make warning sounds to pedestrians or cyclists. Or, when the vehicle needs to yield to pedestrians at the crosswalk, it also needs to proactively remind the pedestrians through voice alert.

However, because existing vehicles are not designed with software and hardware that allow the vehicles to interact with people outside the vehicle, they cannot meet the above needs.

SUMMARY

To solve the above problems, the present disclosure provides a vehicle-mounted human-machine interaction system, in which voice interaction between the vehicle or the person inside the vehicle and the person outside the vehicle is achieved by installing a piezoelectric sound-generating circuit on the vehicle.

One aspect of the present disclosure provides a vehicle-mounted human-machine interaction system. The system includes: a piezoelectric sound-generating circuit disposed in a cavity between a body panel as an outer surface of a vehicle and an interior panel as an inner surface of the vehicle and attached to either the body panel or the interior panel; a wake-up subsystem configured to wake up an on-board controller to turn on a human-machine interaction function based on at least one of voices, movements, or images of objects outside the vehicle; and the on-board controller configured to output an audio signal to the piezoelectric sound-generating circuit after being woken up by the wake-up subsystem to turn on the human-machine interaction function such that as being excited by the audio signal, the piezoelectric sound-generating circuit vibrates the body panel or the interior panel to emit a voice to an exterior of the vehicle.

In some embodiments, the piezoelectric sound-generating circuit includes: a driver circuit configured to receive the audio signal from the on-board controller and convert the audio signal into an excitation voltage; and a piezoelectric ceramic speaker configured to, driven by the excitation voltage generated by the driver circuit, drive the body panel or the interior panel attached thereto to vibrate, thereby emitting the voice.

In some embodiments, the driver circuit includes: a power amplifier configured to modulate a triangle wave signal using the received audio signal to generate a pulse width modulation signal; and an LC filter configured to demodulate the pulse width modulated signal to produce an amplified audio signal as the excitation voltage.

In some embodiments, the power amplifier includes: a voltage/current limiter configured to modulate the triangle wave signal using the received audio signal when being controlled by a feedback output of an audio amplifier; and the audio amplifier configured to amplify the modulated triangle wave signal to generate the pulse width modulated signal.

In some embodiments, the piezoelectric ceramic speaker includes: an electrode piece configured to receive the excitation voltage; a piezoelectric ceramic piece configured to produce transverse or longitudinal expansion or contraction driven by the excitation voltage received through the electrode piece; and a vibration plate attached to the piezoelectric ceramic piece to generate vibration as the piezoelectric ceramic piece elongates or contracts.

In some embodiments, the piezoelectric ceramic speaker further includes: a vibration pad located between the vibration plate and the body panel or between the vibration plate and the interior panel and configured to adjust a frequency response of vibration generated by the vibration plate.

In some embodiments, the piezoelectric ceramic speaker further includes: a counterweight located on a side of the piezoelectric ceramic piece opposite to the vibration plate and configured to adjust the frequency response of the vibration generated by the vibration plate.

In some embodiments, the system further includes: one or more external microphones disposed on an outside of the body panel and configured to receive a voice input from an object outside the vehicle. The on-board controller is further configured to play the received voice input of the object outside the vehicle to a person inside vehicle via a built-in speaker inside the vehicle, or to perform a semantic analysis on the voice input of the person outside the vehicle, and perform control operation on the vehicle based on results of the semantic analysis.

In some embodiments, the wake-up subsystem includes: a sensing component; and disposed on the outside of the vehicle and configured to sense at least one of voices, movements, or images of objects outside the vehicle; and a wake-up processor 134 configured to determine whether at least one of the sensed voice, movement, or image satisfies a predetermined wake-up condition, and to wake up the on-board controller to turn on the human-machine interaction function in response to the predetermined wake-up condition being determined to be satisfied.

In some embodiments, the sensing component includes: one or more vibration sensors disposed on the outside of the body panel or on vehicle glasses and configured to sense a knock on the body panel or on a vehicle glass by the person outside the vehicle. The wake-up processor is configured to determine whether the knock sensed by the one or more vibration sensors satisfies a predetermined knock condition, and to wake up the on-board controller in response to the knock being determined to satisfy the predetermined knock condition.

In some embodiments, the sensing component includes: one or more sensors disposed on the outside of the body panel and configured to sense a distance between an object outside the vehicle and the body panel. The wake-up processor is configured to determine whether the distance satisfies a predetermined distance threshold, and to wake up the on-board controller in response to the distance being determined to satisfy the predetermined distance threshold.

In some embodiments, the system further includes: one or more external cameras disposed on the outside of the body panel and configured to capture an image of the person outside the vehicle. After being waked up by the wake-up processor, the on-board controller is configured to determine an identity of the person outside the vehicle based on the image of the person outside the vehicle, and to perform control operation of the vehicle in response to the person outside the vehicle being determined to be a predetermined person.

In some embodiments, performing control operation of the vehicle by the on-board controller includes: establishing a communication connection with a remote vehicle owner through a vehicle-mounted mobile communication circuit, such that the remote vehicle owner can view objects outside the vehicle or conduct video communication with the person outside the vehicle through the communication connection.

In some embodiments, the system further comprises: one or more external microphones disposed on an outside of the body panel and configured to receive a voice input from a person outside the vehicle. After being waked up by the wake-up processor, the on-board controller is further configured to perform control operation of the vehicle based on the voice input of the person outside the vehicle.

In some embodiments, performing control operation of the vehicle by the on-board controller includes: establishing a communication connection with a remote vehicle owner through a vehicle-mounted mobile communication circuit, such that the remote vehicle owner can conduct audio communication with the person outside the vehicle through the communication connection.

In some embodiments, the sensing component includes: one or more external cameras disposed on the outside of the body panel and configured to capture an image of the person outside the vehicle. The wake-up processor is configured to determine an identity of the person outside the vehicle based on the image of the person outside the vehicle, and to wake up the on-board controller in response to the person outside the vehicle being determined to be a predetermined person.

In some embodiments, the sensing component includes: one or more external cameras disposed on the outside of the body panel and configured to capture one or more images of the person outside the vehicle. The wake-up processor is configured to determine a gesture of the person outside the vehicle based on the one or more images of the person outside the vehicle, and to wake up the on-board controller in response to the gesture of the person outside the vehicle being determined to match a predetermined gesture.

In some embodiments, the sensing component includes: one or more external microphones disposed on an outside of the body panel and configured to receive a voice input from a person outside the vehicle. The wake-up processor is configured to determine whether the voice input of the person outside the vehicle matches a predetermined wake-up word or to determine whether the identity of the person outside the vehicle matches a predetermined person based on the voice input of the person outside the vehicle, and in response to the voice input of the person outside the vehicle being determined to match the predetermined wake-up word or in response to the identity of the person outside the vehicle being determined to match the predetermined person based on the voice input of the person outside the vehicle, the wake-up processor wakes up the on-board controller.

BRIEF DESCRIPTION OF THE DRAWINGS

The present disclosure will be better comprehended, and other objects, details, features, and advantages of the present disclosure will become more apparent by referring to the following description of specific embodiments of the present disclosure given in the accompanying drawings.

DETAILED DESCRIPTION OF THE EMBODIMENTS

Figure 1:
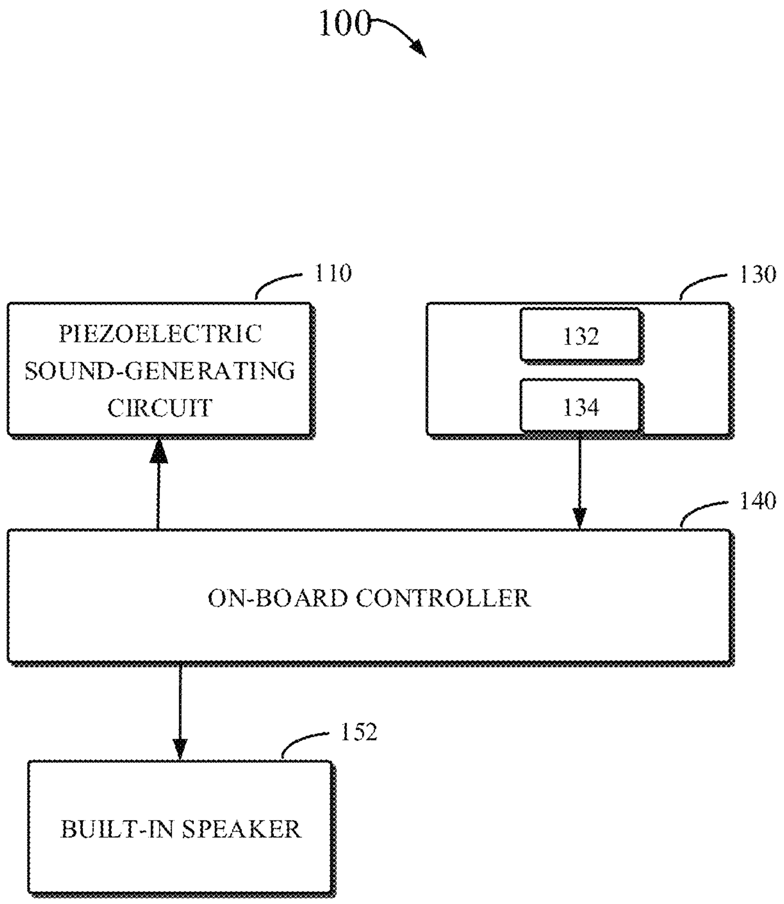
FIG. 1 is a schematic structural diagram of an exemplary vehicle-mounted human-machine interaction system according to some embodiments of the present disclosure.

Various embodiments of the present disclosure will be described in more detail below with reference to the accompanying drawings. Although the embodiments of the present disclosure are shown in the drawings, it should be understood that the present disclosure may be embodied in various forms and should not be limited to the embodiments set forth herein. Rather, these embodiments are provided such that the present disclosure will be thorough and complete, and will fully convey the scope of the present disclosure to those skilled in the art.

In the following description, for the purpose of explaining various embodiments, certain details are set forth in order to provide a thorough understanding of various embodiments. However, those skilled in the art will recognize that these embodiments may be practiced without one or more of these specific details. In other instances, well-known devices, structures, and techniques associated with the present disclosure may not be shown or described in detail to avoid unnecessarily obscuring the description of the embodiments.

Unless required by the context otherwise, throughout the specification and claims, the term "include" and variations thereof, such as "comprising" and "having" shall be understood as having an open, inclusive meaning, that is, shall be interpreted as "including but not limited to".

Throughout the specification, reference to "one embodiment" or "some embodiments" refers to that a particular feature, structure, or characteristic described in connection with the embodiment is included in at least one embodiment. Thus, the appearances of "in one embodiment" or "in some embodiments" in various places throughout this specification are not necessarily all referring to the same embodiment. Additionally, specific features, structures, or characteristics may be combined in various manners in one or more embodiments.

In addition, the terms such as first, second, third, etc. used in the description and claims are only used to distinguish various objects for the sake of clarity of description, and do not limit sizes or orders of the objects they describe unless otherwise indicated.

Figure 2:
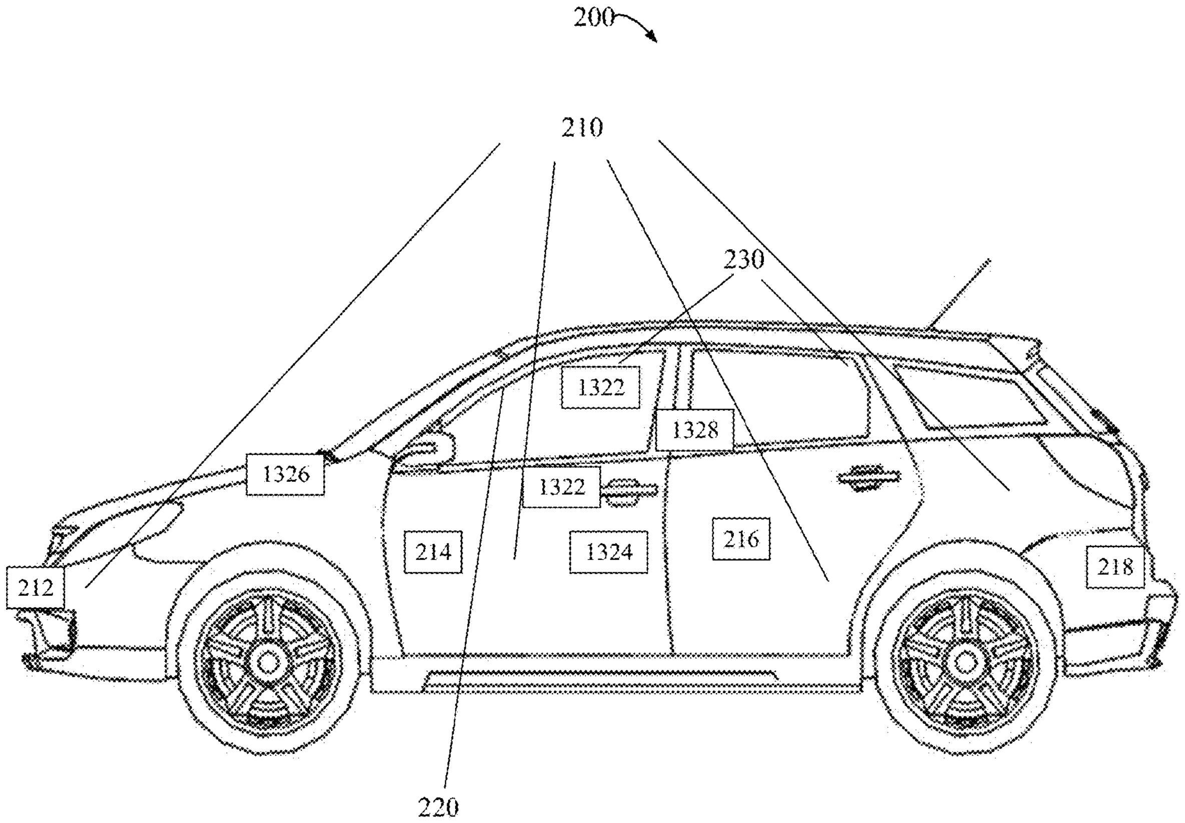
FIG. 2 is a side view of a vehicle equipped with an exemplary vehicle-mounted human-machine interaction system according to some embodiments of the present disclosure.

FIG. 1 is a schematic structural diagram of an exemplary vehicle-mounted human-machine interaction system 100 according to some embodiments of the present disclosure. FIG. 2 is a side view of a vehicle equipped with an exemplary vehicle-mounted human-machine interaction system according to some embodiments of the present disclosure.

FIG. 1 shows a schematic structural diagram of an exemplary vehicle-mounted human-computer interaction system 100 according to an embodiment of the present invention, and FIG. 2 shows a side view of a vehicle 200 equipped with the vehicle-mounted human-computer interaction system 100.

As shown in FIG. 1 and FIG. 2, the vehicle-mounted human-machine interaction system 100 includes one or more piezoelectric sound-generating circuits 110 (one piezoelectric sound-generating circuit 110 is schematically shown in FIG. 1). Each piezoelectric sound-generating circuit 110 may be disposed in a cavity between a body panel 210 as an outer surface of the vehicle 200 and an interior panel 220 as an inner surface of the vehicle 200, and may attached to either the body panel 210 or the interior panel 220. As shown in FIG. 2, the piezoelectric sound-generating circuit 110 may be disposed at any one or more places at a front side 212, a front door 214, a rear door 216, a rear side 218, etc. of the vehicle 200. In some cases, the piezoelectric sound-generating circuits 110 may be symmetrically disposed on both sides of the vehicle 200. Alternatively, the piezoelectric sound-generating circuits 110 may be provided on the back (inside) of a hood of the vehicle 200 or the like.

The vehicle-mounted human-machine interaction system 100 also includes a wake-up subsystem 130 and an on-board controller 140. The wake-up subsystem 130 is configured to wake up the on-board controller 140 based on at least one of voices, movements, or images of objects outside the vehicle 200, and to turn on human-machine interaction function. In this case, the objects outside the vehicle 200 may include people outside the vehicle 200 or physical objects outside the vehicle 200 (such as another vehicle or obstacle, etc.).

After being woken up by the wake-up subsystem 130 to turn on the human-machine interaction function, the on-board controller 140 is configured to output an audio signal to the piezoelectric sound-generating circuit 110 such that as being excited by the audio signal, the piezoelectric sound-generating circuit 110 vibrates the body panel 210 or the interior panel 220 to emit a voice to an exterior of the vehicle 200.

Figure 3:
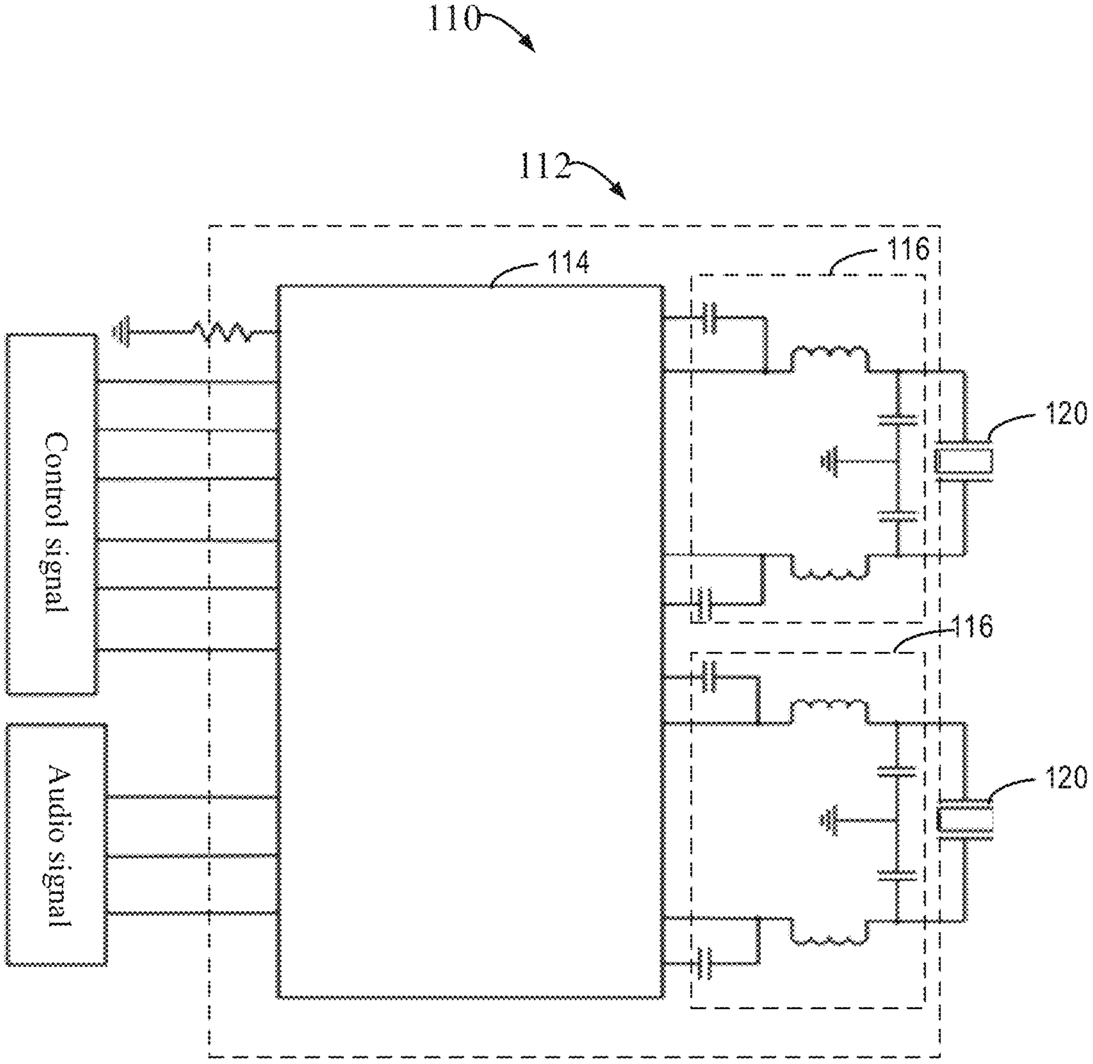
FIG. 3 is a schematic diagram of an exemplary piezoelectric sound-generating circuit according to some embodiments of the present disclosure.

FIG. 3 is a schematic diagram of an exemplary piezoelectric sound-generating circuit according to some embodiments of the present disclosure. As shown in FIG. 3, the piezoelectric sound-generating circuit 110 includes a driver circuit 112 and a piezoelectric ceramic speaker 120. The driver circuit 112 receives the audio signal from the on-board controller 140 and converts the audio signal into an excitation voltage. Driven by the excitation voltage generated by the driver circuit 112, the piezoelectric ceramic speaker 120 drives the body panel 210 or the interior panel 220 attached thereto to vibrate, thereby emitting the voice.

Figure 4:
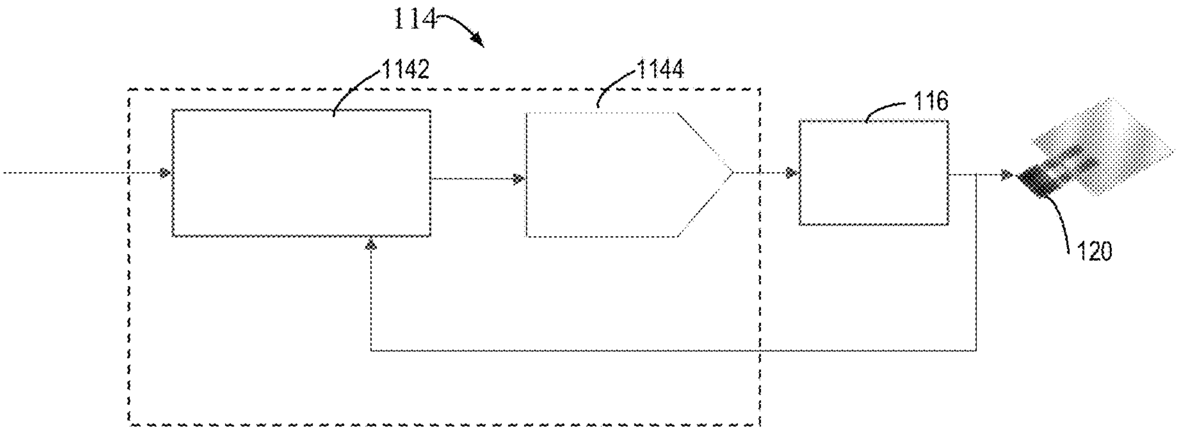
FIG. 4 is a schematic diagram of a driver circuit in an exemplary piezoelectric sound-generating circuit according to some embodiments of the present disclosure.

FIG. 4 is a schematic diagram of a driver circuit in an exemplary piezoelectric sound-generating circuit according to some embodiments of the present disclosure. As shown in FIG. 3 and FIG. 4, the driver circuit 112 includes a power amplifier 114 and an LC filter 116. The power amplifier 114 is configured to modulate a triangle wave signal using the received audio signal to generate a pulse width modulation signal, and the LC filter 116 is configured to demodulate the pulse width modulated signal to produce an amplified audio signal as an excitation voltage for the piezoelectric ceramic speaker 120. For example, as shown in FIG. 3, the power amplifier 114 modulates the triangle wave signal based on the audio signal output by the on-board controller 140 as the audio signal source and the control signal of the on-board controller 140 (or other control components of the vehicle 200). Because piezoelectric ceramics are capacitive devices, the power amplifier 114 includes a class D power amplifier, for example, a TI DRV5825P chip.

As shown in FIG. 4, the power amplifier 114 may include a voltage/current limiter 1142 and an audio amplifier 1144 connected in series. When being controlled by a feedback output of the audio amplifier 114, the voltage/current limiter 1142 is configured to modulate the triangle wave signal using the received audio signal, and the audio amplifier 1144 is configured to amplify the modulated triangle wave signal to generate the pulse width modulated signal.

In this case, the voltage/current limiter 1142 is a combination of a pulse width modulator (PWM) and a triangle wave (or sawtooth wave) oscillation generator, in which an input audio signal, such as a time division multiplexing (TDM) audio signal, is compared with the triangular wave signal generated by the triangular wave oscillation generator to produce a square wave signal whose width changes with the input audio signal, that is, the pulse width modulation signal. Here, the triangle wave oscillation generator can be considered as a sampling clock of the audio signal.

In addition, as shown in FIG. 4, an output of the LC filter 116 may also be fed back to an input of the voltage/current limiter 1142 to form a negative feedback loop, such that based on a load (i.e., the piezoelectric ceramic speaker 120) impedance characteristics, the output excitation voltage can be corrected to achieve voltage limiting and current limiting functions.

In this case, the LC filter 116 is a low-pass passive filter, which can be a half-bridge or a full-bridge. Two full-bridge LC filters are schematically shown in FIG. 3. Each full-bridge LC filter includes two half-bridge LC circuits connected in parallel. Each half-bridge LC circuit includes a capacitor I and an inductor (L) connected in series.

In addition, although not shown in the drawings, a current steering switch, such as two parallel p-channel and n-channel MOSFETs, may be included between the power amplifier 114 and the LC filter 116 to connect the output of the power amplifier alternately to an internal operating voltage VDD and the ground voltage, thereby outputting a high-frequency square wave with alternating polarity.

Figure 5:
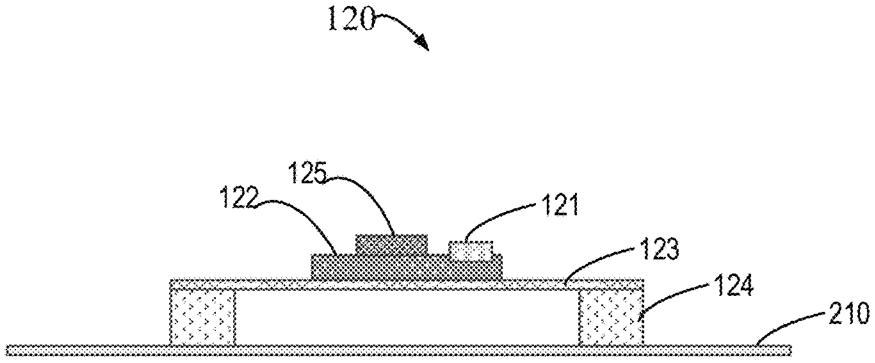
FIG. 5 is a schematic diagram of a piezoelectric ceramic speaker in an exemplary piezoelectric sound-generating circuit according to some embodiments of the present disclosure.

FIG. 5 is a schematic diagram of a piezoelectric ceramic speaker in an exemplary piezoelectric sound-generating circuit 110 according to some embodiments of the present disclosure. As shown in FIG. 5, the piezoelectric ceramic speaker 120 includes an electrode piece 121 configured to receive the excitation voltage from the driver circuit 112. The electrode piece 121 may be a pair of positive and negative electrode pieces. The piezoelectric ceramic speaker 120 may further include a piezoelectric ceramic piece 122 configured to produce transverse or longitudinal expansion or contraction driven by the excitation voltage received through the electrode piece 121. As mentioned above, the excitation voltage may be a high-frequency square wave with alternating polarity, such the piezoelectric ceramic piece 122 can produce mechanical deformation, that is, elongation or contraction, driven by the square wave with alternating polarity. In addition, the piezoelectric ceramic piece 122 may be a transversely or longitudinally polarized piezoelectric ceramic piece, thereby producing transverse or longitudinal mechanical deformation driven by the excitation voltage. FIG. 4 exemplarily shows a transversely polarized piezoelectric ceramic piece 122. When driven by a positive voltage (i.e., an upper surface of the piezoelectric ceramic piece 122 is connected to a positive electrode of the excitation voltage, and a lower surface of the piezoelectric ceramic piece 122 is connected to a negative electrode of the excitation voltage), the piezoelectric ceramic piece 122 elongates laterally (i.e., extends along a radial direction of a surface of a vibration plate 123). When driven by a negative voltage (i.e., the upper surface of the piezoelectric ceramic piece 122 is connected to the negative electrode of the excitation voltage, and the lower surface of the piezoelectric ceramic piece 122 is connected to the positive electrode of the excitation voltage), the piezoelectric ceramic piece 122 contracts laterally (i.e., shrinks along the radial direction of the surface of the vibration plate 123). The longer a lateral length of the piezoelectric ceramic piece 122 is, the stronger a low-frequency response of the vibration is.

The piezoelectric ceramic speaker 120 also includes the vibration plate 123, which is attached to the piezoelectric ceramic piece 122 and generates vibration as the piezoelectric ceramic piece 122 elongates or contracts. In this way, the piezoelectric ceramic speaker 120 converts the input excitation voltage into vibration, thereby emitting sound.

In some embodiments, the vibration plate 123 may be directly attached to the body panel 210 or the interior panel 220 to drive the body panel 210 or the interior panel 220 to vibrate. The larger an area of the body panel 210 or the interior panel 220 that the piezoelectric ceramic speaker 120 drives to vibrate, the stronger the low-frequency response of the vibration and the weaker a high-frequency response of the vibration.

In some other embodiments, the piezoelectric ceramic speaker 120 may also include a vibration pad 124, which is located between the vibration plate 123 and the body panel 210 or between the vibration plate 123 and the interior panel 220 (only the body panel 210 is shown in FIG. 4), as shown in FIG. 4. The frequency response of the vibration generated by the vibration plate 123 can be adjusted using the vibration pad 124. For example, if the low-frequency response of the vibration needs to be enhanced, an area of the vibration pad 124 may be increased, and if the low-frequency response of the vibration needs to be weakened, the area of the vibration pad 124 may be reduced.

In addition, in some embodiments, the piezoelectric ceramic speaker 120 may also include a counterweight 125 located on the other side of the piezoelectric ceramic piece 122 opposite to the vibration plate 123. The counterweight 125 may also be used to adjust the frequency response of the vibration generated by the vibration plate 123. For example, if the low-frequency response of the vibration needs to be enhanced, a weight of the counterweight 125 may be increased. Conversely, if the low-frequency response of the vibration needs to be weakened, the weight of the counterweight 125 may be reduced.

Because the piezoelectric ceramic piece 122 itself often has the desired high-frequency response, the desired low-frequency response can be easily obtained by adapting the area of the vibration pad 124 and/or the weight of the counterweight 125.

Those skilled in the art should understand that the piezoelectric ceramic speaker 120 shown in FIG. 5 is merely illustrative, and may not be used to limit the scope of the present disclosure. For example, in some embodiments, the electrode piece 121 may be disposed at a different position on the piezoelectric ceramic piece 122, or may apply the excitation voltage to the piezoelectric ceramic piece 122 in other forms. Alternatively, in some embodiments, multiple counterweights 125 and the like may be provided in the piezoelectric ceramic speaker 120. Furthermore, in some embodiments, the piezoelectric ceramic speaker 120 may include a plurality of piezoelectric ceramic pieces 122 and corresponding pairs of electrode pieces 121. For example, one piezoelectric ceramic piece 122 may be disposed on each of an upper side and a lower side of the vibration plate 123 (e.g., another piezoelectric ceramic piece 122 is disposed symmetrically with the shown piezoelectric ceramic piece 122 under the vibration plate 123), and the two piezoelectric ceramic pieces 122 are respectively driven by the electrode pieces to elongate or contract in opposite directions, thereby further enhancing a vibration effect.

When the piezoelectric sound-generating circuit 110 is in operation state, the on-board controller 140 may control the piezoelectric sound-generating circuit 110 to emit various reminder voices, such as a voice to remind of vehicle approach/passing, a voice to remind a person outside the vehicle about a left-behind item (for example, the person outside the car has just gotten out of the vehicle), voice reminders of weather conditions or safety instructions, etc.

In some actual application scenarios, the piezoelectric sound-generating circuit 110 may not always be in operation state. When a person inside the vehicle actively wants to send a voice to the outside of the vehicle, the person may actively operate the on-board controller 140 to emit a sound through the piezoelectric sound-generating circuit 110, such as issuing a voice reminder or playing music. However, in the case where a person outside the vehicle wants to interact with the vehicle or another person inside the vehicle, or in the case where an object outside the vehicle is an object such as another vehicle, the vehicle-mounted human-machine interaction system 100 may wake up the on-board controller 140 to enable the human-machine interaction function through the wake-up subsystem 130 based on at least one of a voice, a movement, or an image of an external object. As such, the wake-up subsystem 130 may include a sensing component 132 and a wake-up processor 134. The sensing component 132 is disposed outside the vehicle 200 and is configured to sense at least one of voices, movements, or images of objects outside the vehicle. The wake-up processor 134 is configured to determine whether at least one of the sensed voice, movement, or image satisfies a predetermined wake-up condition. When it is determined that the predetermined wake-up condition is met, the wake-up processor 134 wakes up the on-board controller 140 to enable the human-computer interaction function.

In some embodiments, the sensing component 132 may include one or more vibration sensors 1322, which may be disposed on the exterior side of the body panel 210 (e.g., near the front window) or on vehicle glasses 230 (as shown in FIG. 2). The one or more vibration sensors 1322 are configured to sense a knock on the body panel 210 or on a vehicle glass 230 by a person outside the vehicle. In this case, the wake-up processor 134 is configured to determine whether the knock sensed by the one or more vibration sensors 1322 satisfies a predetermined knock condition. When it is determined that the predetermined knock condition is met, the wake-up processor 134 wakes up the on-board controller 140 to turn on the human-machine interaction function. For example, the predetermined knock condition may include a predetermined number of consecutive knocks (such as 2 or 3 times). The wake-up processor 134 may determine that the predetermined knock condition is met when it is determined that the number of knocks sensed by the one or more vibration sensors 1322 reaches the predetermined number of consecutive knocks. In this way, the wake-up subsystem 130 can easily understand the intention of the person outside the vehicle to interact with the vehicle 200 through the intentional knocking behavior of the person outside the vehicle, thereby controlling the on-board controller 140 to turn on the human-machine interaction function.

Further, when determining whether the predetermined knock condition is met, the wake-up processor 134 may also filter out knocks whose intensity is lower than a predetermined threshold. In this way, the wakeup subsystem 130 can identify valid knocks and filter out invalid or unintentional knocks.

In some other embodiments, the sensing component 132 may include one or more sensors 1324, which may be disposed on the exterior side of the body panel 210 (as shown in FIG. 2). The one or more sensors 1324 are configured to sense a distance between the object outside the vehicle and the body panel 210. For example, the one or more sensors 1324 may be a biometric sensor such as an infrared proximity sensor, or a sensor such as a proximity ultrasonic sensor or a UWB (ultra-wideband) sensor that can sense people or other objects outside the vehicle and determine a distance between the object outside the vehicle and the vehicle 200. In this case, the wake-up processor 134 is configured to determine whether the distance sensed by the biometric sensor 1324 meets a predetermined distance threshold, and to wake up the on-board controller 140 to turn on the human-machine interaction function when it is determined that the predetermined distance threshold is met. For example, the predetermined distance threshold may be a distance smaller than a conventional safety distance, and may have different values or ranges depending on the sensed object (i.e., whether it is a person or other object outside the vehicle). For example, when the object outside the vehicle is a person, the predetermined distance threshold may be a value in the range of 0.2 meters to 0.5 meters, and when the object outside the vehicle is another vehicle, the predetermined distance threshold may be a value in the range of 5 meters to 10 meters. In this case, the wake-up processor 134 may determine that the predetermined wake-up condition is met when determining that the distance sensed by the one or more sensors 1324 is less than the distance threshold. In this way, the wake-up subsystem 130 can easily understand the intention of the person outside the vehicle to interact with the vehicle 200 through the behavior of the person outside the vehicle that is obviously too close to the vehicle 200, thereby controlling the on-board controller 140 to enable the human-machine interaction function. Alternatively, the wake-up subsystem 130 may actively send a voice reminder to other vehicles when the other vehicles are too close to the vehicle 200 to remind the other vehicles to pay attention to the distance between vehicles.

In some other embodiments, the sensing component 132 may include one or more external cameras 1326, which may be disposed on the exterior side of the body panel 210. For example, the one or more external cameras 1326 may be disposed near the front window glass of the vehicle 200 (e.g., above B column of the vehicle 200), as shown in FIG. 2. The one or more external cameras 1326 are configured to capture an image of the person outside the vehicle. In this case, the wake-up processor 134 is configured to determine an identity of the person outside the vehicle based on the image of the person outside the vehicle, and to wake up the on-board controller 140 to start the human-machine interaction function when it is determined that the identity of the person outside the vehicle is a predetermined person. For example, in the case where the vehicle 200 is a vehicle used by a family, images of permitted users of the vehicle 200 (such as members of the family) may be pre-stored in the wake-up processor 134. The image of the person outside the vehicle obtained by the one or more external cameras 1326 is compared with the pre-stored images of the permitted users to determine whether the person outside the vehicle belongs to the permitted users. Alternatively, in the case where the vehicle 200 is a self-driving shared or rental vehicle, the wake-up processor 134 may obtain an image of the user who reserved the vehicle via the on-board controller 140 or other vehicle-mounted terminal, and may use the one or more external cameras 1326 to obtain the image of the person outside the vehicle. The image of the person outside the vehicle is compared with the pre-stored image of the user who reserved the vehicle to determine whether the person outside the vehicle is the user who reserved the vehicle. In this way, the wake-up subsystem 130 can easily determine that the person outside the vehicle is the person who wants to interact with the vehicle 200 through the image of the person outside the vehicle, thereby controlling the on-board controller 140 to turn on the human-machine interaction function. In this case, the on-board controller 140 can play welcome music or voice to the person outside the vehicle through the piezoelectric sound-generating circuit 110, or can send other voices, such as requiring the person outside the vehicle to provide any specific permission credential (such as a verification code sent to the person by a booking platform when booking the vehicle 200, etc.) for further interaction with the person outside the vehicle.

In some other embodiments, the wake-up processor 134 may determine a gesture of the person outside the vehicle based on one or more images obtained by the one or more external cameras 1326, and may wake up the on-board controller 140 to enable the human-machine interaction function when it is determined that the gesture of the person outside the vehicle matches a predetermined gesture. For example, the predetermined gesture may be a hand waving movement. In this case, the wake-up processor 134 may determine whether the person outside the vehicle is waving toward the vehicle 200 based on the obtained images, and may wake up the on-board controller 140 when it is determined that the person outside the vehicle is waving toward the vehicle 200. In this way, the wake-up subsystem 130 can easily determine the intention of the person outside the vehicle to interact with the vehicle 200 through the images of the person outside the vehicle, thereby controlling the on-board controller 140 to enable the human-machine interaction function. For example, in the case where the vehicle 200 is a self-driving taxi, the wake-up subsystem 130 can easily determine that the person outside the vehicle wants to ride in the vehicle 200 through the hand waving movement of the person outside the vehicle, and can enable the human-machine interaction function to communicate through voice to further confirm the person's riding intention with the person outside the vehicle or perform other identity verification operations.

In some other embodiments, the sensing component 132 may include one or more external microphones 1328, which may be disposed on the exterior side of the body panel 210 (as shown in FIG. 2). The one or more external microphones 1328 are configured to receive the voice input from the person outside the vehicle. In this case, the wake-up processor 134 is configured to determine whether the voice input of the person outside the vehicle matches a predetermined wake-up word or to determine whether the identity of the person outside the vehicle matches a predetermined person based on the voice input of the person outside the vehicle. When it is determined that the voice input of the person outside the vehicle matches the predetermined wake-up word or it is determined that the identity of the person outside the vehicle matches the predetermined person based on the voice input of the person outside the vehicle, the wake-up processor 134 wakes up the on-board controller 140 to enable the human-machine interaction function. For example, if the vehicle 200 is a taxi, the wake-up word may include "chuzuche" or "taxi" or the like. In this case, the wake-up processor 134 may determine whether the voice input received by the one or more external microphones 1328 matches the wake-up word. If it is determined that the voice input matches the wake-up word, the wake-up processor 134 wakes up the on-board controller 140 to enable the human-machine interaction function. Alternatively, in the case where the vehicle 200 is a vehicle for home use, the wake-up processor 134 may pre-store voiceprints of permitted users of the vehicle 200 (e.g., members of the family), and may analyze the voice input received by the one or more external microphones 1328 to obtain the voiceprint of the person outside the vehicle and compare the voiceprint with the voiceprints of the pre-stored permitted users to determine whether the person outside the vehicle is one of the permitted users. In this way, the wake-up subsystem 130 can easily determine that the person outside the vehicle is the person who wants to interact with the vehicle 200 through the voice input of the person outside the vehicle, thereby controlling the on-board controller 140 to turn on the human-machine interaction function. In this case, the on-board controller 140 may play welcome music or voice to the person outside the vehicle through the piezoelectric sound-generating circuit 110, or may emit other voices, such as requiring the person outside the vehicle to provide a specific permission credential (such as the verification code sent to the person by the booking platform when booking the vehicle 200) for further interaction with the person outside the vehicle.

In addition, the one or more external microphones 1328 may also be used to actively receive the voice input from the person outside the vehicle and the on-board controller 140 is configured to play the received voice input to the person inside the vehicle 200 via a built-in speaker (the built-in speaker 152 connected to the on-board controller 140 as shown in FIG. 1). In this way, voice transmission between the person inside the vehicle and the person outside the vehicle can be achieved, thereby facilitating voice interaction between the person inside the vehicle and the person outside the vehicle.

In some embodiments, the one or more external microphones 1328 may perform a semantic analysis on the voice input of the person outside the vehicle, and may perform control operation on the vehicle 200 based on results of the semantic analysis. For example, in the case where the person outside the vehicle is one of the permitted users of the vehicle 200 (which can be determined through the image or voiceprint method or other suitable methods) and the voice input is "trunk", the on-board controller 140 may semantically analyze the voice input. Combined with a current trunk status (i.e., whether the trunk is closed or open), the on-board controller 140 determines whether the result of the semantic analysis is to open or close the trunk. For example, in the case of the trunk being currently closed, the result of the semantic analysis is determined to be "open the trunk", and in the case of the trunk being currently open, the result of the semantic analysis is determined to be "close the trunk". In this case, the on-board controller 140 may control the vehicle 200 according to the result of the semantic analysis, such as closing or opening the trunk.

In some embodiments, as part of the vehicle-mounted human-machine interaction system 100, a prompt device (not shown in the drawings), such as a prompt light, may also be configured for and around the one or more external microphones 1328. The prompt device is activated when the on-board controller 140 turns on the human-machine interaction function to prompt the person outside the vehicle of the location of the one or more external microphones 1328 such that the person outside the vehicle can interact with the vehicle 200 or the person inside the vehicle 200 through the one or more external microphones 1328.

In some embodiments, the on-board controller 140 may perform different control operations based on the identity of the person outside the vehicle. Specifically, the wake-up processor 134 and/or the on-board controller 140 may further determine an authority corresponding to the identity of the person outside the vehicle, and the on-board controller 140 may perform different control operations on the vehicle 200 based on the authority. For example, when the identity of the person outside the vehicle is the vehicle owner or a driver authorized by the vehicle owner, the on-board controller 140 may determine that the person outside the vehicle has the highest authority. The voice input of the person outside the vehicle may be used to control various operations of the vehicle 200, such as opening/closing the door, the trunk, the front hatch, the charging port, the fuel port, etc. Various information such as the fuel level and electricity capacity of the vehicle 200, and weather information may be provided according to requests of the person outside the vehicle. In the case where the person outside the vehicle is identified as a driver not authorized by the vehicle owner, the on-board controller 140 may further contact the vehicle owner (for example, through a vehicle customer service center or through a dedicated application program) to further confirm with the vehicle owner whether the person outside the vehicle is authorized. In the case that the person outside the vehicle is authorized by the vehicle owner, the person outside the vehicle is granted with the highest authority as mentioned above. On the other hand, if the identity of the person outside the vehicle is a passenger authorized by the vehicle owner, the on-board controller 140 may determine that the person outside the vehicle has a general authority, and may control various general operations of the vehicle 200 based on the voice input of the person outside the vehicle, such as opening/closing the vehicle door, the trunk, etc., and may provide the general information, such as weather information, etc. upon request from the person outside the vehicle.

In some embodiments, the on-board controller 140 may perform a voice call operation with the person outside the vehicle after being woken up by the wake-up subsystem 130 without recognizing the identity of the person outside the vehicle. Specifically, in the case of being woken up by a knock from the person outside the vehicle, the on-board controller 140 may enable the human-machine interaction function to receive the voice input of the person outside the vehicle. In some embodiments, the on-board controller 140 may directly analyze the voice input and perform corresponding control operations on the vehicle 200. Alternatively or additionally, the on-board controller 140 may establish a voice connection with the remote vehicle owner such that the person outside the vehicle can communicate with the remote vehicle owner through the voice connection.

In the embodiments of the present disclosure, the on-board controller 140 and the wake-up processor 134 are described separately. However, those skilled in the art should understand that the present disclosure is not limited thereto, and the wake-up processor 134 may also be implemented as a component of the on-board controller 140.

In addition, in the embodiments of the present disclosure, the one or more vibration sensors 1322, the one or more sensors 1324, the one or more external cameras 1326, and the one or more external microphones 1328, etc. are described as separate implementations of the sensing component 132. However, those skilled in the art should understand that the present disclosure is not limited thereto. The sensing component 132 may include any one or more of the one or more vibration sensors 1322, the one or more sensors 1324, the one or more external cameras 1326, and the one or more external microphones 1328. In some embodiments, the sensing component 132 may only include the one or more vibration sensors 1322 and/or the one or more sensors 1324 to wake up the on-board controller 140. In this regard, the vehicle-mounted human-machine interaction system 100 may still include the one or more external cameras and/or the one or more external microphones used as a hardware device to support further human-machine interaction function. For convenience of description, the same reference numerals as above are still used to describe the one or more external cameras and/or one or more external microphones. In some embodiments, the vehicle-mounted human-machine interaction system 100 may include the one or more external cameras 1326. In this case, the on-board controller 140 is also configured to, after being woken up by the wake-up processor 134, determine the identity of the person outside the vehicle based on the image of the person outside the vehicle, and perform the control operation on the vehicle when the identity of the person outside the vehicle is determined to be the intended person. For example, the on-board controller 140 may establish a communication connection with the remote vehicle owner through a vehicle-mounted mobile communication circuit (such as a vehicle-mounted 4G or 5G communication circuit), such that the remote vehicle owner can view objects outside the vehicle or conduct video communication with the person outside the vehicle through the communication connection. For example, when the vehicle 200 performs applications such as self-service shopping, refueling, and car rental, the remote vehicle owner may view the purchased items, gas stations, or car rental personnel through the communication connection established by the on-board controller 140, or may conduct video communication with the shopping place staff, the gas station staff, or the car rental personnel to further perform required services. Alternatively or additionally, in some embodiments, the vehicle-mounted human-machine interaction system 100 may include the one or more external microphones 1328. In this case, the on-board controller 140 is further configured to, after being woken up by the wake-up processor 134, perform vehicle control operations based on the voice input of the person outside the vehicle received by the one or more external microphones 1328. For example, the on-board controller 140 may establish the communication connection with the remote vehicle owner through the vehicle-mounted mobile communication circuit (such as the vehicle-mounted 4G or 5G communication circuit), such that the person outside the vehicle can make voice calls with the remote vehicle owner through the communication connection. For example, when the vehicle 200 performs the refueling, the car rental, and other applications, the remote vehicle owner may communicate with the shopping mall staff, the gas station staff, or the car rental staff through the communication connection established by the on-board controller 140 to further conduct the required services.

Except for specific hardware components, such as the piezoelectric sound-generating circuit 110 and the sensing component 132, the remaining part of the present disclosure may be implemented in the form of software, hardware or firmware. When implemented as a computer program product by software, the computer program product may include a computer-readable storage medium having computer-readable program instructions thereon for performing various aspects of the present disclosure.

Figure 6:
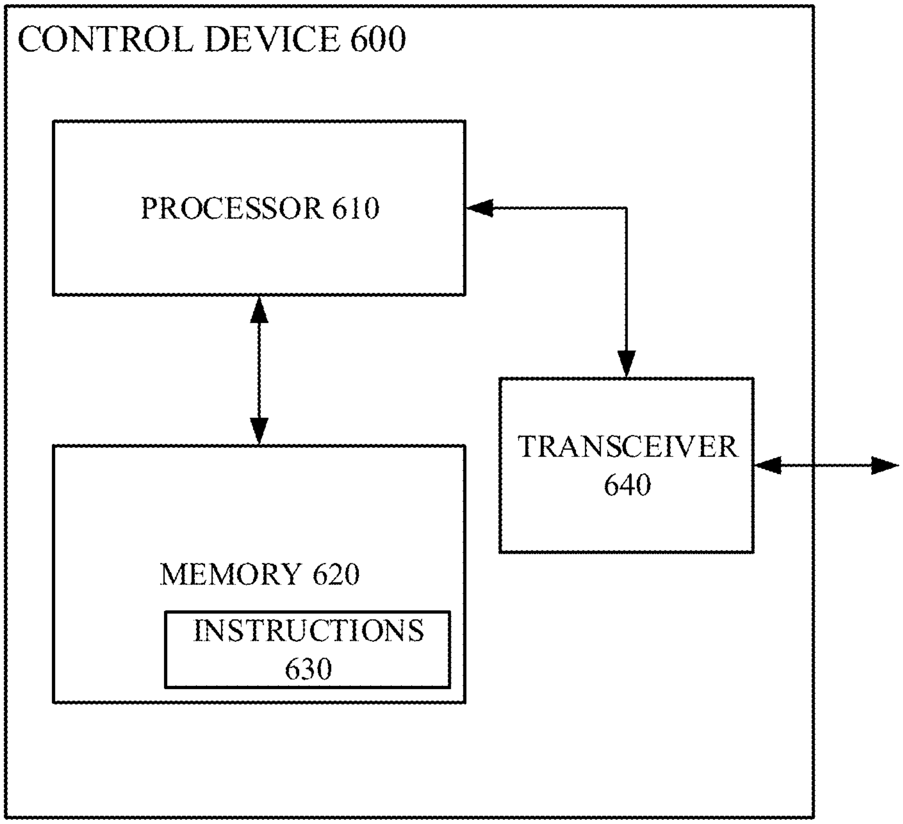
FIG. 6 is a functional block diagram of an exemplary control device according to some embodiments of the present disclosure.

FIG. 6 is a functional block diagram of an exemplary control device 600 according to some embodiments of the present disclosure. The control device 600 may be used to implement the on-board controller 140 and/or the wake-up processor 134 as described above.

As shown in FIG. 6, the control device 600 may include a processor 610. The processor 610 controls the operation and functionality of the control device 600. For example, in some embodiments, the processor 610 may perform various operations via instructions 630 stored in memory 620 coupled thereto. The memory 620 may be of any type suitable for the local technology environment and may be implemented using any suitable data storage technology, including but not limited to semiconductor-based storage devices, magnetic storage devices and systems, and optical storage devices and systems. Although only one memory 620 is shown in FIG. 6, those skilled in the art should understand that the control device 600 may include more physically different memories 620.

The processor 610 may be of any type suitable for the local technology environment and may include, but is not limited to, one or more of general-purpose computers, special purpose computers, microprocessors, digital signal processors (DSPs), and multi-core architecture processors. The control device 600 may also include multiple processors 610. The multiple processors 610 are coupled to a transceiver 640, which may receive and transmit information via one or more communication components. All features described above with reference to FIGS. 1 to 5 regarding the on-board controller 140 and/or the wake-up processor 134 are applicable to the control device 600 and will not be described again herein.

In one or more exemplary designs, the functions described in the present disclosure may be implemented in hardware, software, firmware, or any combination thereof. For example, if implemented in software, the functions may be stored on or transmitted over as one or more instructions or code on a computer-readable medium.

Each unit of the device disclosed herein may be implemented using discrete hardware components, or may be integrated and implemented on a hardware component, such as a processor. For example, a general-purpose processor, a digital signal processor (DSP), an application specific integrated circuit (ASIC), a field programmable gate array (FPGA) or other programmable logic devices, discrete gates or transistor logic, discrete hardware components, or any combination that can be used to perform the functions described herein, may be used to implement or perform various illustrative logical blocks, modules, and circuits described in connection with the present disclosure.

Those of ordinary skill in the art will further appreciate that the various illustrative logical blocks, modules, circuits, and algorithm steps described in connection with the embodiments of the present disclosure may be implemented as electronic hardware, computer software, or combination thereof.

The above description of the present disclosure is provided to enable any person skilled in the art to make or use the present disclosure. Various modifications to the present disclosure will be readily apparent to those skilled in the art, and the general principles defined herein may be applied to other variations without departing from the spirit and scope of the present disclosure. Thus, the present disclosure is not intended to be limited to the embodiments and designs described herein but is to be accorded the broadest scope consistent with the principles and novel features disclosed herein.

What is claimed is:

1. A vehicle-mounted human-machine interaction system, comprising:

a piezoelectric sound-generating circuit disposed in a cavity between a body panel as an outer surface of a vehicle and an interior panel as an inner surface of the vehicle and attached to either the body panel or the interior panel;

a wake-up subsystem configured to wake up an on-board controller to turn on a human-machine interaction function based on at least one of voices, movements, or images of objects outside the vehicle; and the on-board controller configured to output an audio signal to the piezoelectric sound-generating circuit after being woken by the wake-up subsystem to turn on the human-machine interaction function such that as being excited by the audio signal, the piezoelectric sound-generating circuit vibrates the body panel or the interior panel to emit a voice to an exterior of the vehicle;

wherein the piezoelectric sound-generating circuit includes a driver circuit, configured to receive the audio signal from the on-board controller and convert the audio signal into an excitation voltage, the driver circuit including:

a power amplifier configured to modulate a triangle wave signal using the received audio signal to generate a pulse width modulated signal; and an LC filter configured to demodulate the pulse width modulated signal to produce an amplified audio signal as the excitation voltage.

2. The system according to claim 1, wherein the piezoelectric sound-generating circuit further comprises:

a piezoelectric ceramic speaker configured to, driven by the excitation voltage generated by the driver circuit, drive the body panel or the interior panel attached thereto to vibrate, thereby emitting the voice.

3. The system according to claim 1, wherein the power amplifier comprises:

a voltage/current limiter configured to modulate the triangle wave signal using the received audio signal when being controlled by a feedback output of an audio amplifier; and the audio amplifier connected in series to the voltage/current limiter and configured to amplify the modulated triangle wave signal to generate the pulse width modulated signal.

4. The system according to claim 2, wherein the piezoelectric ceramic speaker comprises:

an electrode piece configured to receive the excitation voltage;

a piezoelectric ceramic piece configured to produce transverse or longitudinal expansion or contraction driven by the excitation voltage received through the electrode piece; and a vibration plate attached to the piezoelectric ceramic piece to generate vibration as the piezoelectric ceramic piece elongates or contracts.

5. The system according to claim 4, wherein the piezoelectric ceramic speaker further comprises:

a vibration pad located between the vibration plate and the body panel or between the vibration plate and the interior panel and configured to adjust a frequency response of vibration generated by the vibration plate.

6. The system according to claim 4, wherein the piezoelectric ceramic speaker further comprises:

a counterweight located on a side of the piezoelectric ceramic piece opposite to the vibration plate and configured to adjust the frequency response of the vibration generated by the vibration plate.

7. The system according to claim 1, further comprising:

one or more external microphones disposed on an outside of the body panel and configured to receive a voice input from an object outside the vehicle;

wherein the on-board controller is further configured to play the received voice input of a person outside the vehicle to a person inside vehicle via a built-in speaker inside the vehicle, or to perform a semantic analysis on the voice input of the object outside the vehicle, and perform control operation on the vehicle based on results of the semantic analysis.

8. The system according to claim 1, wherein the wake-up subsystem comprises:

a sensing component disposed on the outside of the vehicle and configured to sense at least one of voices, movements, or images of objects outside the vehicle; and a wake-up processor configured to determine whether at least one of the sensed voice, movement, or image satisfies a predetermined wake-up condition, and to wake up the on-board controller to turn on the human-machine interaction function in response to the predetermined wake-up condition being determined to be satisfied.

9. The system according to claim 8, wherein the sensing component comprises:

one or more vibration sensors disposed on the outside of the body panel or on vehicle glasses and configured to sense a knock on the body panel or on a vehicle glass by the person outside the vehicle;

wherein the wake-up processor is configured to determine whether the knock sensed by the one or more vibration sensors satisfies a predetermined knock condition, and to wake up the on-board controller in response to the knock being determined to satisfy the predetermined knock condition.

10. The system according to claim 8, wherein the sensing component comprises:

one or more sensors disposed on the outside of the body panel and configured to sense a distance between an object outside the vehicle and the body panel;

wherein the wake-up processor is configured to determine whether the distance satisfies a predetermined distance threshold, and to wake up the on-board controller in response to the distance being determined to satisfy the predetermined distance threshold.

11. The system according to claim 9, further comprising:

one or more external cameras disposed on the outside of the body panel and configured to capture an image of the person outside the vehicle;

wherein after being woken up by the wake-up processor, the on-board controller is configured to determine an identity of the person outside the vehicle based on the image of the person outside the vehicle, and to perform control operation of the vehicle in response to the person outside the vehicle being determined to be a predetermined person.

12. The system according to claim 11, wherein performing control operation of the vehicle by the on-board controller comprises:

establishing a communication connection with a remote vehicle owner through a vehicle-mounted mobile communication circuit, such that the remote vehicle owner can view objects outside the vehicle or conduct video communication with the person outside the vehicle through the communication connection.

13. The system according to claim 9, further comprising:

one or more external microphones disposed on an outside of the body panel and configured to receive a voice input from a person outside the vehicle;

wherein after being woken up by the wake-up processor, the on-board controller is further configured to perform control operation of the vehicle based on the voice input of the person outside the vehicle.

14. The system according to claim 13, wherein performing control operation of the vehicle by the on-board controller comprises:

establishing a communication connection with a remote vehicle owner through a vehicle-mounted mobile communication circuit, such that the remote vehicle owner can conduct audio communication with the person outside the vehicle through the communication connection.

15. The system according to claim 8, wherein the sensing component comprises:

one or more external cameras disposed on the outside of the body panel and configured to capture an image of the person outside the vehicle;

wherein the wake-up processor is configured to determine an identity of the person outside the vehicle based on the image of the person outside the vehicle, and to wake up the on-board controller in response to the person outside the vehicle being determined to be a predetermined person.

16. The system according to claim 8, wherein the sensing component comprises:

one or more external cameras disposed on the outside of the body panel and configured to capture one or more images of the person outside the vehicle;

wherein the wake-up processor is configured to determine a gesture of the person outside the vehicle based on the one or more images of the person outside the vehicle, and to wake up the on-board controller in response to the gesture of the person outside the vehicle being determined to match a predetermined gesture.

17. The system according to claim 8, wherein the sensing component comprises:

one or more external microphones disposed on an outside of the body panel and configured to receive a voice input from a person outside the vehicle;

wherein the wake-up processor is configured to determine whether the voice input of the person outside the vehicle matches a predetermined wake-up word or to determine whether the identity of the person outside the vehicle matches a predetermined person based on the voice input of the person outside the vehicle, and in response to the voice input of the person outside the vehicle being determined to match the predetermined wake-up word or in response to the identity of the person outside the vehicle being determined to match the predetermined person based on the voice input of the person outside the vehicle, the wake-up processor wakes up the on-board controller.

18. The system according to claim 10, further comprising:

one or more external cameras disposed on the outside of the body panel and configured to capture an image of the person outside the vehicle;

wherein after being woken up by the wake-up processor, the on-board controller is configured to determine an identity of the person outside the vehicle based on the image of the person outside the vehicle, and to perform control operation of the vehicle in response to the person outside the vehicle being determined to be a predetermined person.

19. The system according to claim 10, further comprising:

one or more external microphones disposed on an outside of the body panel and configured to receive a voice input from a person outside the vehicle;

wherein after being woken up by the wake-up processor, the on-board controller is further configured to perform control operation of the vehicle based on the voice input of the person outside the vehicle.

20. A vehicle-mounted human-machine interaction system, comprising:

a piezoelectric sound-generating circuit disposed in a cavity between a body panel as an outer surface of a vehicle and an interior panel as an inner surface of the vehicle and attached to either the body panel or the interior panel;

a wake-up subsystem configured to wake up an on-board controller to turn on a human-machine interaction function based on at least one of voices, movements, or images of objects outside the vehicle; and the on-board controller configured to output an audio signal to the piezoelectric sound-generating circuit after being woken by the wake-up subsystem to turn on the human-machine interaction function such that as being excited by the audio signal, the piezoelectric sound-generating circuit vibrates the body panel or the interior panel to emit a voice to an exterior of the vehicle;

wherein the piezoelectric sound-generating circuit includes:

a driver circuit configured to receive the audio signal from the on-board controller and convert the audio signal into an excitation voltage; and a piezoelectric ceramic speaker configured to, driven by the excitation voltage generated by the driver circuit, drive the body panel or the interior panel attached thereto to vibrate, thereby emitting the voice, the piezoelectric ceramic speaker including:

an electrode piece configured to receive the excitation voltage;

a piezoelectric ceramic piece configured to produce transverse or longitudinal expansion or contraction driven by the excitation voltage received through the electrode piece; and a vibration plate attached to the piezoelectric ceramic piece to generate vibration as the piezoelectric ceramic piece elongates or contracts.

* * * * *